United States Patent
Kobayashi et al.

(10) Patent No.: US 11,324,147 B2
(45) Date of Patent: May 3, 2022

(54) COOLANT FLOW COOLING STRUCTURE FOR A POWER CONVERSION DEVICE

(71) Applicant: Hitachi Astemo, Ltd., Hitachinaka (JP)

(72) Inventors: Takeshi Kobayashi, Tochigi (JP);
Daiki Kudo, Tochigi (JP); Masahiro Shimada, Tochigi (JP); Kenichi Sasaki, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 56 days.

(21) Appl. No.: 16/681,335

(22) Filed: Nov. 12, 2019

(65) Prior Publication Data
US 2020/0214180 A1 Jul. 2, 2020

(30) Foreign Application Priority Data

Dec. 26, 2018 (JP) .............................. JP2018-242004

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01); *H05K 7/20254* (2013.01); *H05K 7/20945* (2013.01)

(58) Field of Classification Search
CPC .... H05K 7/06; H05K 7/1432; H05K 7/20218; H05K 7/20254–20263; H05K 7/20272; H05K 7/2039; H05K 7/20927–20936; H05K 7/20445; H05K 7/48; H05K 7/20509; H05K 7/20945; H05K 5/008; H05K 5/061; H05K 5/069; H05K 5/0052; H01L 23/4006; H01L 23/42; H01L 23/3672;
(Continued)

(56) References Cited

U.S. PATENT DOCUMENTS 7,477,513 B1 * 1/2009 Cader ................. H01L 23/4735
165/80.4
10,684,662 B2 * 6/2020 Moore ................. H05K 9/0007
(Continued)

FOREIGN PATENT DOCUMENTS

DE WO2012/152551 A1 * 11/2012 ............... H05K 7/20
JP 2011-078217 4/2011
JP 2011078217 A * 4/2011 .............. H02M 7/48

OTHER PUBLICATIONS

English translation of JP 2011078217A (Year: 2011).*
English Translation of WO2012/152551 (Year: 2012).*

*Primary Examiner* — Jayprakash N Gandhi
*Assistant Examiner* — Amir A Jalali
(74) *Attorney, Agent, or Firm* — Rankin, Hill & Clark LLP (57) ABSTRACT

A power conversion device includes a cooling structure capable of cooling down, by a coolant that flows through a first flow channel formed by a first wall portion and a second wall portion facing with each other, a first electronic component and a second electronic component mounted on an external surface of the first wall portion. The first wall portion is formed in a stepwise shape, and includes a first mount portion on which the first electronic component is mounted, a second mount portion which has a different height from the first mount portion, and on which the second electronic component is mounted, and a first connection portion that is extended between the first mount portion and the second mount portion.

12 Claims, 4 Drawing Sheets

(58) Field of Classification Search
CPC ....... H01L 23/473; H01L 24/00; H01L 24/33; H01L 25/072; H01L 2224/00; H01L 2224/01; H01L 2223/4062; H01L 2223/4087; H02M 7/003; H02M 7/48; H01H 9/52
See application file for complete search history.

(56) References Cited

U.S. PATENT DOCUMENTS

| | | | |
|---|---|---|---|
| 2010/0290190 A1* | 11/2010 | Chester | H05K 7/20772 361/701 |
| 2014/0063741 A1* | 3/2014 | Muller | H05K 7/20927 361/700 |
| 2015/0289411 A1* | 10/2015 | Kamiya | H05K 7/20263 361/701 |
| 2016/0183407 A1* | 6/2016 | Katsumata | H05K 1/0203 361/699 |
| 2016/0242313 A1* | 8/2016 | Singh | H05K 3/0061 |
| 2016/0255745 A1* | 9/2016 | Govindassamy | H05K 13/00 361/715 |
| 2017/0181264 A1* | 6/2017 | Brey | H05K 1/0203 |
| 2017/0341638 A1* | 11/2017 | Sawada | H01L 23/46 |
| 2018/0030976 A1* | 2/2018 | Naeli | F04B 43/14 |
| 2018/0186215 A1* | 7/2018 | Ogasawara | F24H 1/009 |
| 2020/0068749 A1* | 2/2020 | Ono | H05K 7/20927 |
| 2020/0211927 A1* | 7/2020 | Wan | H01L 21/4882 |

* cited by examiner

COOLANT FLOW COOLING STRUCTURE FOR A POWER CONVERSION DEVICE

FIELD OF THE INVENTION

The present disclosure relates to a power conversion device that has an interior of a casing through which a coolant flows.

BACKGROUND

A power conversion device is placed between, for example, a battery and a motor, and controls and supplies power stored in the battery to the motor. Since power conversion devices loaded in hybrid vehicles or electric vehicles, i.e., a large number of sub-units (e.g., a power module and a reactor) which form a Power Control Unit (PCU) may decrease the performance because of heat generation, a cooling structure is essential. Various cooling technologies have been proposed so far (e.g., see JP 2011-78217 A).

A power conversion device disclosed in JP 2011-78217 A includes a semiconductor device (a first electronic component), a reactor (a second electronic component), and a container (a cooling structure) that forms a flow channel for a coolant which cools down these components. The container is formed in a cuboid shape, and includes a ceiling portion (a first wall portion) and a bottom portion (a second wall portion) to which the semiconductor device and the reactor are attached, respectively.

More specifically, the ceiling portion includes a first opening and a second opening. The first opening is closed by a first base member to which the semiconductor device is fastened. Cooling fins are provided on a surface (internal surface) of the first base member at the flow-channel side.

Heat generated by the semiconductor device is transferred to the coolant via the first base member, and thus the semiconductor device is cooled down. The reactor is also cooled down by the similar mechanism.

Patent Literature Document 1: Japanese Patent Application Laid-Open Publication No. 2011-78217

SUMMARY OF THE INVENTION

As described above, the power conversion device is loaded on a vehicle. Accordingly, vibration when, for example, the vehicle is running is transmitted to the power conversion device as external force. It is preferable to sufficiently consider the rigidity of the power conversion device against such external force.

An objective of the present disclosure is to provide a power conversion device that includes a cooling structure with a high rigidity.

A power conversion device according to an embodiment of the present disclosure includes:

a cooling structure capable of cooling down, by a coolant that flows through a first flow channel formed by a first wall portion and a second wall portion facing with each other, a first electronic component and a second electronic component mounted on an external surface of the first wall portion, wherein the first wall portion is formed in a stepwise shape, and comprises:

a first mount portion on which the first electronic component is mounted;

a second mount portion which has a different height from the first mount portion, and on which the second electronic component is mounted; and a first connection portion that is extended between the first mount portion and the second mount portion.

It is preferable that the second wall portion should be formed in a stepwise shape along a shape of the first wall portion.

It is preferable that the second wall portion should include a second connection portion that faces the first connection portion, a rib that is extended along a flowing direction of the coolant should be provided on an external surface of the second wall portion at an opposite side to the first flow channel, and the rib should form a part of the second connection portion.

It is preferable that a peripheral wall portion that is formed in a frame shape which is extended outwardly and which has a tip opened should be integrally provided with an external surface of the second wall portion at an opposite side to the first flow channel, the opening of the peripheral wall portion should be closed by a lid fastened to a bottom of a third electronic component, and a region surrounded by the peripheral wall portion and the lid should form a second flow channel for the coolant.

It is preferable that the rib should be integrally provided with the second wall portion and the peripheral wall portion.

It is preferable that a flow-channel portion of the first flow channel held between the first connection portion and the second wall portion should be a communication portion, and a cross-sectional area of a discharging opening of the communication portion should be smaller than a cross-sectional area of an inlet opening.

According to the present disclosure, the power conversion device includes the cooling structure capable of cooling down, by the coolant that flows through the first flow channel formed by the first wall portion and the second wall portion facing with each other, the first electronic component and the second electronic component mounted on the external surface of the first wall portion. The first wall portion is formed in a stepwise shape, and includes the first mount portion on which the first electronic component is mounted, the second mount portion which has a different height from the first mount portion, and on which the second electronic component is mounted, and the first connection portion that is extended between the first mount portion and the second mount portion. Accordingly, the bending rigidity of the first wall portion is enhanced, and thus the rigidity of the cooling structure is enhanced.

According to the above-described power conversion device, the second wall portion is formed in a stepwise shape along a shape of the first wall portion. Hence, in addition to the first wall portion, the bending rigidity of the second wall portion is also enhanced, and thus the rigidity of the cooling structure is further enhanced.

According to the above-described power conversion device, the second wall portion includes the second connection portion that faces the first connection portion. The rib that includes the second connection portion is provided on the external surface of the second wall portion. The rib extends in the orthogonal direction to the lengthwise direction of the second connection portion. That is, the rib is provided so as to go over the step of the second wall portion. Thus, the rigidity of the second wall portion is further enhanced.

According to the above-described power conversion device, a peripheral wall portion is integrally provided with an external surface of the second wall portion. The opening of the peripheral wall portion is closed by the lid fastened to a bottom of the third electronic component. The region surrounded by the peripheral wall portion and the lid forms the second flow channel for the coolant. That is, the cooling structure that cools down the third electronic component is integrally formed with the second wall portion. Accordingly, the number of components for the power conversion device can be reduced, and thus the power conversion device can be downsized.

According to the above-described power conversion device, the rib is integrally provided with the second wall portion and the peripheral wall portion. Accordingly, the rib achieves a role of reinforcing not only the second wall portion but also the peripheral wall portion.

According to the above-described power conversion device, the flow-channel portion of the first flow channel held between the first connection portion and the second wall portion is a communication portion, and a cross-sectional area of a discharging opening of the communication portion is smaller than a cross-sectional area of an inlet opening. Accordingly, the flow speed of the coolant can be increased, and thus the cooling efficiency is improved.

DETAILED DESCRIPTION OF THE EMBODIMENTS

Embodiments of the present disclosure will be described below with reference to the accompanying figures. In the figures, Fr, Rr, L, R, Up, and Dn represent a front side, a rear side, a left side, a right side, an upper side, and a lower side, respectively.

First Embodiment

Figure 1:
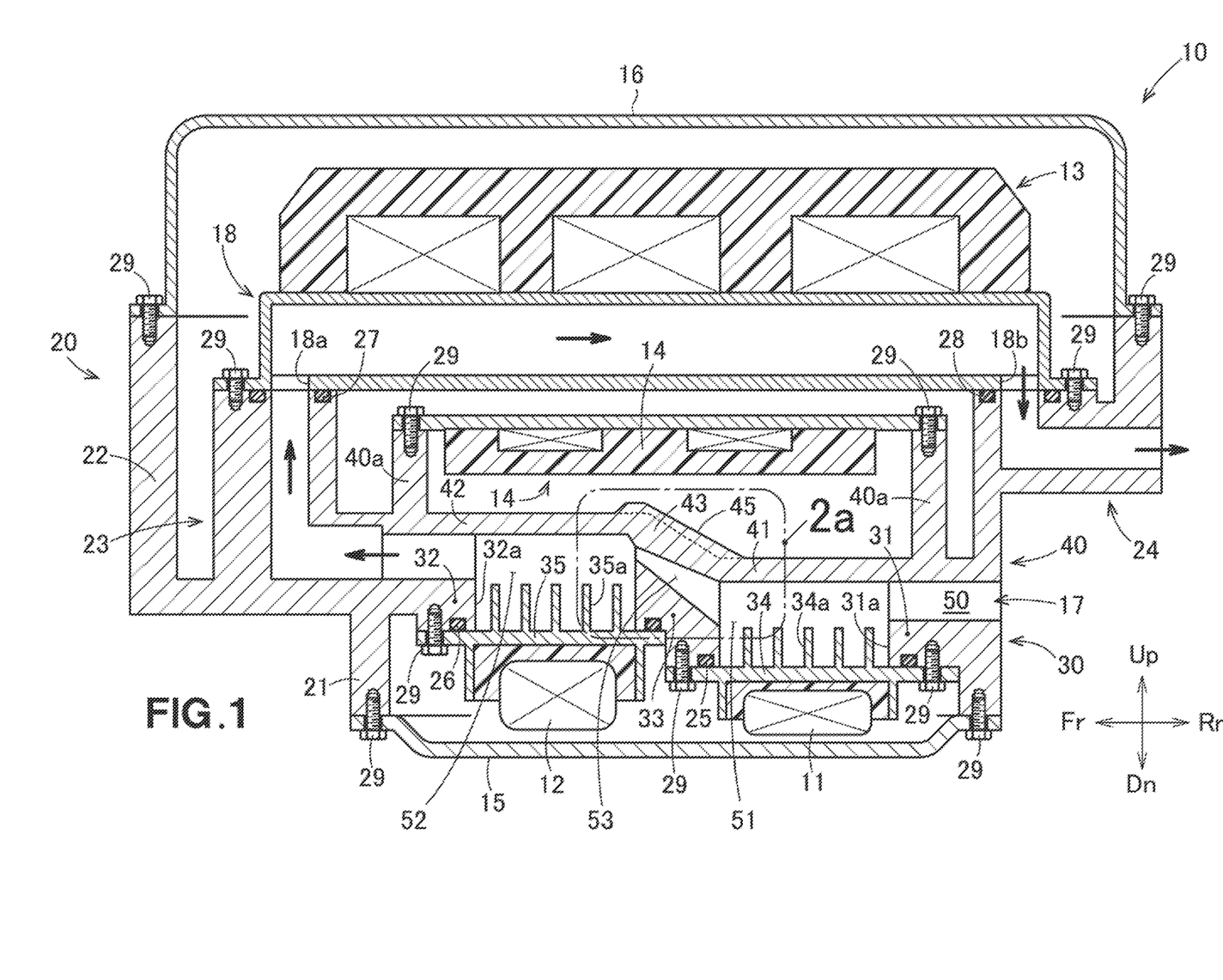
FIG. 1 is an exemplarily diagram for a power conversion device according to a first embodiment.

With reference to FIG. 1, a power conversion device 10 includes a DC-DC converter 11 (a first electronic component 11), a reactor 12 (a second electronic component 12), a power module 13 (a third electronic component 13), a capacitor 14 (a fourth electronic component 14), a casing 20 that retains therein those components, a lower lid 15 that closes the lower part of the casing 20, and an upper lid 16 that closes the upper part of the casing 20.

The casing 20 includes a cooling structure 17 that cools down the DC-DC converter 11 and the reactor 12. Moreover, a cooling body 18 that cools down the power module 13 is provided in the casing 20 separately from the casing 20.

The casing 20 is provided with a first bottom portion 30 (a first wall portion 30) and a second bottom portion 40 (a second wall portion 40) that face with each other with a clearance therebetween, a first external wall portion 21 that is extended downwardly from the first bottom portion 30, a second external wall portion 22 that is extended upwardly from the second bottom portion 40, a cylindrical portion 23 which is extended upwardly from the first bottom portion 30 and from the second bottom portion 40, and which is in communication with a first flow channel, and a drain portion 24 that becomes a discharging opening for a coolant which has passed through the interior of the casing 20. Those are formed integrally with each other The first bottom portion 30 and the second bottom portion 40 form a first flow channel 50 that is a flow channel for the coolant which flows from the rear side to the front side. The first bottom portion 30 includes a first mount portion 31 which is formed in a stepwise shape and on which the DC-DC converter 11 is mounted, a second mount portion 32 which is higher than the first mount portion 31 and on which the reactor 12 is mounted, and a first connection portion 33 that is extended between the first mount portion 31 and the second mount portion 32.

A first opening 31a is provided in the first mount portion 31. A sealing member 25 is provided around an edge of the first opening 31a.

The first opening 31a is closed by a first flat plate 34 to which the DC-DC converter 11 is fastened. The first flat plate 34 is fastened by screws 29. Fins 34a are formed on a surface (internal surface) of the first flat plate 34 at the flow-channel side.

A second opening 32a is provided in the second mount portion 32. A sealing member 26 is provided around an edge of the second opening 32a. The second opening 32a is closed by a second flat plate 35 to which the reactor 12 is fastened. The second flat plate 35 is fastened by the screws 29. Fins 35a are formed on a surface (internal surface) of the second flat plate 35 at the flow-channel side.

Support portions 40a and 40a which extend upwardly and which support the capacitor 14 are formed on the second bottom portion 40. The cooling body 18 that has an interior through which the coolant passes is provided above the capacitor 14. The power module 13 is fastened to the upper surface of the cooling body 18. A sealing member 27 is provided at an upper end of the cylindrical portion 23. A sealing member 28 is provided at an upper end of the drain portion 24. One end 18a of the cooling body 18 is in communication with the upper end of the cylindrical portion 23. The other end 18b of the cooling body 18 is in communication with the upper end of the drain portion 24.

The DC-DC converter 11 and the reactor 12 are surrounded by the first external wall portion 21. The lower lid 15 is fastened to the lower part of the first external wall portion 21 by the screws 29. The power module 13 and the capacitor 14 are surrounded by the second external wall portion 22. The upper lid 16 is fastened to the upper part of the second external wall portion 22 by the screws 29.

Figure 2A:
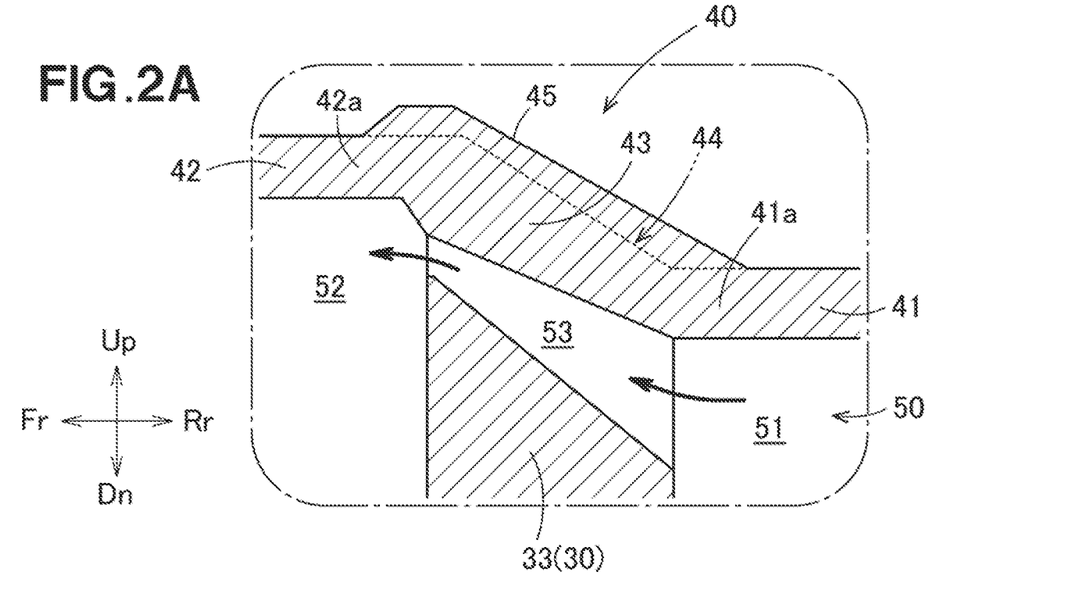
FIG. 2A is a cross-sectional view for a first flow channel of the power conversion device illustrated in FIG. 1.
Figure 2B:
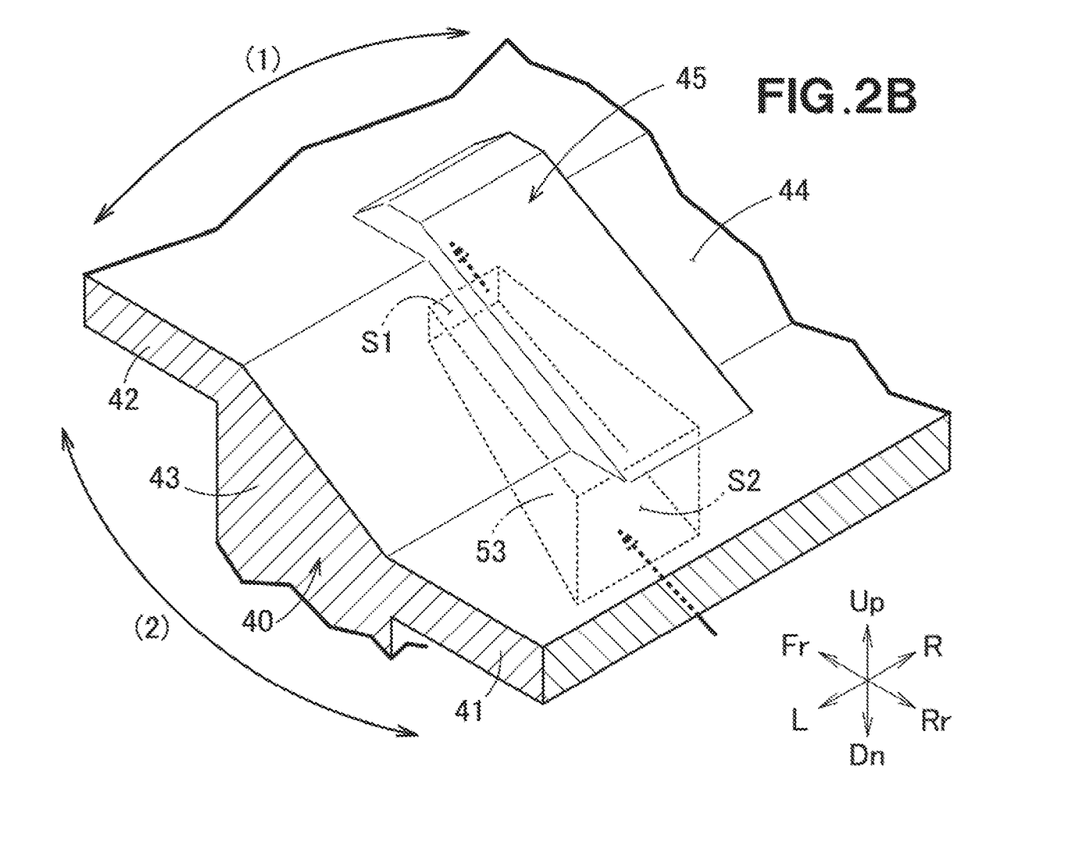
FIG. 2B is a perspective view for the first flow channel of the power conversion device illustrated in FIG. 1.

With reference to FIG. 2A and FIG. 2B, the second bottom portion 40 is in a stepwise shape along the shape of the first bottom portion 30. That is, the second bottom portion 40 includes a first opposing portion 41 that faces the first mount portion 31, a second opposing portion 42 that faces the second mount portion 32, and a second connection portion 43 that is extended between the first opposing portion 41 and the second opposing portion 42.

The first flow channel 50 includes an upstream portion 51 that is a region held between the first mount portion 31 and the first opposing portion 41, a downstream portion 52 that is a region held between the second mount portion 32 and the second opposing portion 42, and a communication portion 53 which is a region held between the first connection portion 33 and second connection portion 43, and which causes the upstream portion 51 and the downstream portion 52 to be in communication with each other.

A rib 45 that is extended in the back-and-forth direction (the flowing direction of the coolant) is provided on an external surface 44 of the second bottom portion 40. This rib 45 forms a part of the second connection portion 43. More specifically, the rib 45 is provided from a rear end 41a of the first opposing portion 41 to a front end 42a of the second opposing portion 42 so as to go over the step. The rib 45 is located above the communication portion 53.

The communication portion 53 is a narrower flow channel than the upstream portion 51 and the downstream portion 52. The communication portion 53 has the flow channel that becomes narrow toward the forward side. A cross-sectional area S1 of the discharging opening of the communication portion 53 is smaller than a cross-sectional area S2 of the inlet opening.

Advantageous effects according to the first embodiment will be described below.

With reference to FIGS. 1, 2A, and 2B, the power conversion device 10 includes the first flow channel 50 formed by the first bottom portion 30 and second bottom portion 40 that face with each other. The coolant that flows through the first flow channel 50 cools down the DC-DC converter 11 and the reactor 12 which are mounted on the external surface of the first bottom portion 30.

The first bottom portion 30 is in a stepwise shape, and includes the first mount portion 31 on which the DC-DC converter 11 is mounted, the second mount portion 32 which is higher than the first mount portion 31 and on which the reactor 12 is mounted, and the first connection portion 33 that is extended between the first mount portion 31 and the second mount portion 32. Accordingly, the bending rigidity of the first bottom portion 30 is enhanced, and the rigidity of the cooling structure 17 is also enhanced.

In addition, the second mount portion 32 is located at the internal (upper) side of the casing 20 relative to the first mount portion 31. Since the height of the reactor 12 provided on the second mount portion 32 is assimilated, the power conversion device 10 can be downsized.

In addition, the second bottom portion 40 is formed in a stepwise shape along the shape of the first bottom portion 30. Therefore, as indicated by an arrow (1), the bending rigidity of the second bottom portion 40 is also enhanced, and thus the rigidity of the cooling structure 17 is further enhanced.

In addition, the rib 45 that is extended in the back-and-forth direction is provided on the external surface of the second bottom portion 40. This rib 45 forms a part of second connection portion 43. More specifically, the rib 45 is provided from the rear end 41a of the first opposing portion 41 to the front end 42a of the second opposing portion 42. Accordingly, as indicated by an arrow (2), the bending rigidity of the second bottom portion 40 is also enhanced, and thus the rigidity of the cooling structure 17 is further enhanced.

In addition, the cross-sectional area 51 of the discharging opening of the communication portion 53 is smaller than the cross-sectional area S2 of the inlet opening. This increases the flow speed of the coolant when flowing through the communication portion 53, and thus the cooling efficiency is improved.

In addition, as for the casing 20, the first bottom portion 30, the second bottom portion 40, the first external wall portion 21, the second external wall portion 22, the cylindrical portion 23, and the drain portion 24 are formed integrally with each other. Hence, the number of components for the power conversion device 10 can be reduced, and thus the power conversion device 10 can be downsized.

Second Embodiment

Figure 3:
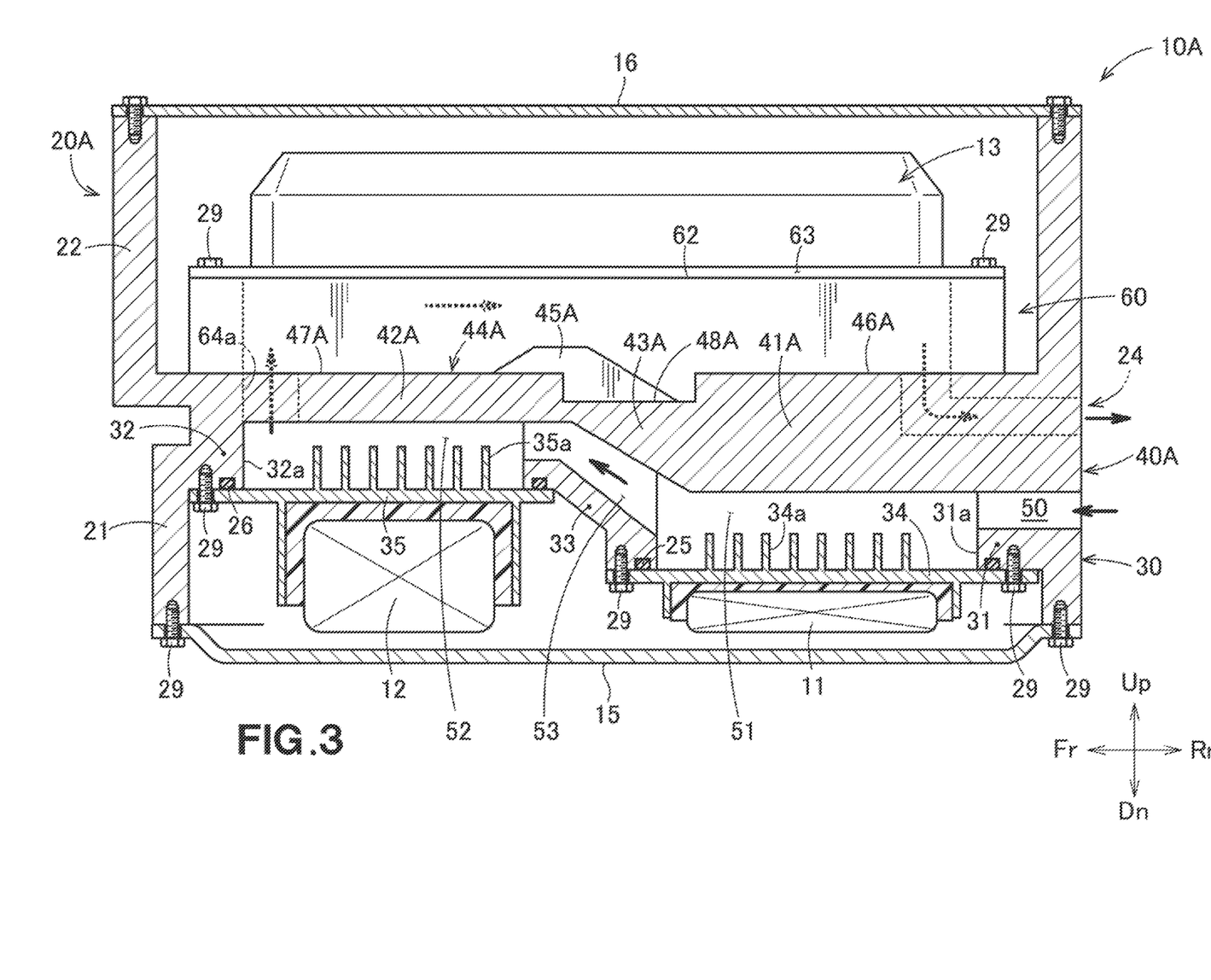
FIG. 3 is an exemplarily diagram for a power conversion device according to a second embodiment.
Figure 4:
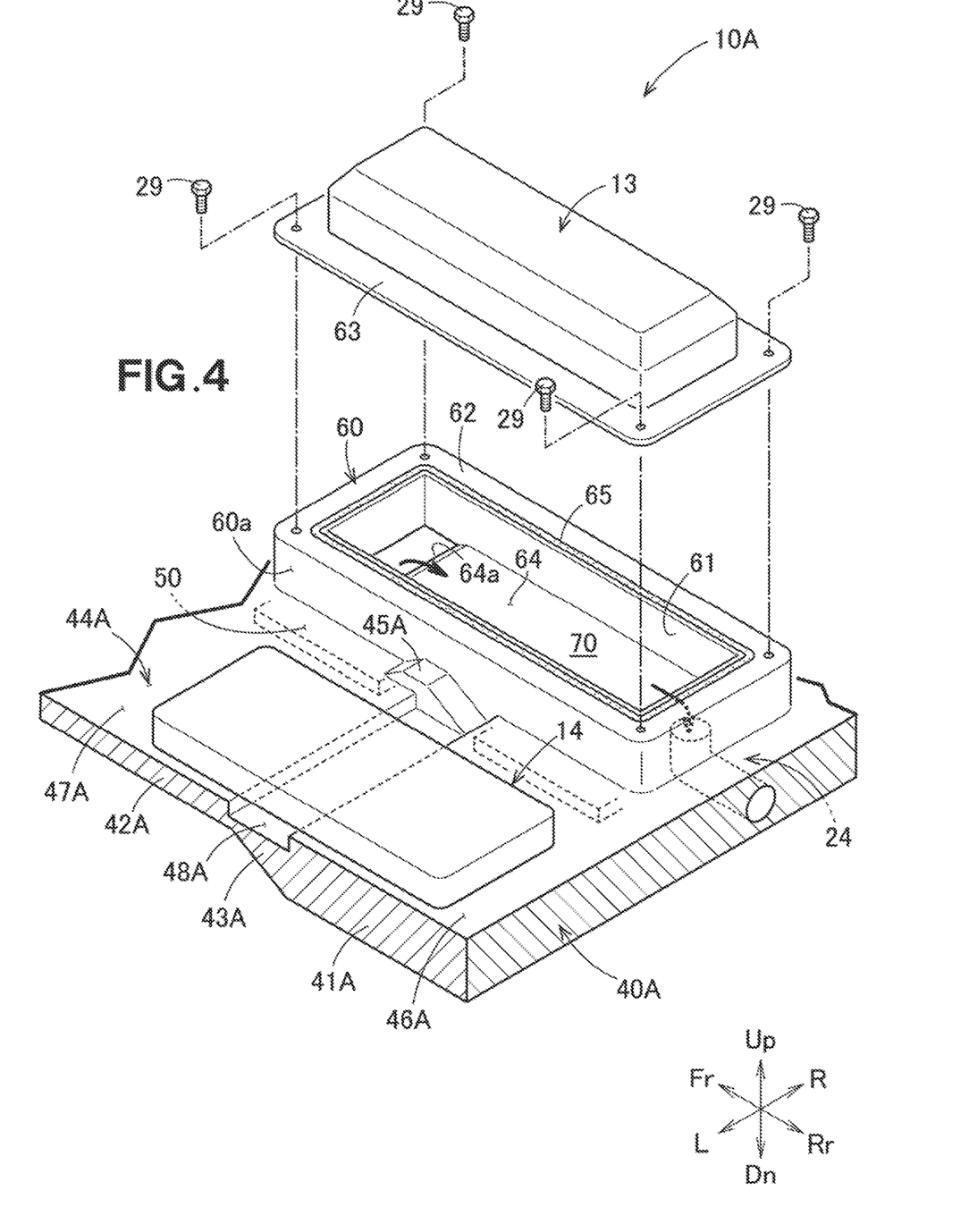
FIG. 4 is a diagram for describing a peripheral wall portion in the power conversion device illustrated in FIG. 3.

With reference to FIGS. 3 and 4, an external surface 44A of a second bottom portion 40A of a casing 20A in a power conversion device 10A is a substantially flat surface. An external surface 46A of a first opposing portion 41A and an external surface 47A of a second opposing portion 42A are located at the same height. An external surface 48A of the second connection portion 43A is concaved.

A peripheral wall portion 60 that is extended upwardly (outwardly) from the external surface 44A is provided on the external surface 44A of the second bottom portion 40A at the opposite side to the first flow channel 50. A sealing member 65 is provided on an upper end surface 62 (tip 62) of the opening 61 of the peripheral wall portion 60 at the upper side. The upper end surface 62 of the opening 61 is closed by a third flat plate 63 (a lid 63) fastened to the bottom of the power module 13. The region surrounded by the peripheral wall portion 60 and the third flat plate 63 forms a second flow channel 70 for the coolant. Fins (unillustrated) are provided on a surface (internal surface) of the third flat plate 63 at the flow-channel side.

A communication hole 64a that is in communication with the first flow channel 50 is provided in the front end of the bottom portion 64 of the peripheral wall portion 60. That is, the second flow channel 70 is in communication with the first flow channel 50 via the communication hole 64a.

A rib 45A is provided integrally with a left wall portion 60a in the second connection portion 43A, the second opposing portion 42A and the peripheral wall portion 60. The capacitor 14 is placed at the left side of the power module 13.

The other same structure as that of the first embodiment will be denoted by the same reference numeral, and the duplicated description will be omitted. The second embodiment accomplishes the following advantageous effects in addition to those of the first embodiment.

The peripheral wall portion 60 that is extended upwardly (outwardly) from the external surface 44A is integrally provided with the external surface 44A of the second bottom portion 40A. The opening 61 of the peripheral wall portion 60 at the upper side is closed by the third flat plate 63 fastened to the bottom of the power module 13. The region surrounded by the peripheral wall portion 60 and the third plate 63 forms the second flow channel 70 for the coolant. That is, in addition to the first flow channel 50, some portions that form the second flow channel 70 are also formed integrally with the casing 20A. Accordingly, the number of components for the power conversion device 10A can be reduced, and thus the power conversion device 10A can be downsized.

In addition, the rib 45A is formed integrally with the left wall portion 60a in the second connection portion 43A, the second opposing portion 42A and the peripheral wall portion 60. Accordingly, the rib accomplishes a role that reinforces not only the second bottom portion 40A but also the peripheral wall portion 60.

Note that the power conversion device according to the present disclosure can be loaded on other vehicles than hybrid vehicles. That is, the present disclosure is not limited to the above embodiments as long the actions and effects of the present disclosure are achievable.

INDUSTRIAL APPLICABILITY

The power conversion device according to the present disclosure is suitable for four-wheel vehicles.

What is claimed is:
1. A power conversion device comprising:
a cooling structure capable of cooling down, by a coolant that flows through a first flow channel formed by a first wall portion and a second wall portion facing with each other, a first electronic component and a second electronic component mounted on an external surface of the first wall portion, wherein the first wall portion is formed in a stepwise shape, and comprises:

a first mount portion on which the first electronic component is mounted;

a second mount portion which has a different height from the first mount portion, and on which the second electronic component is mounted; and a first connection portion that is extended between the first mount portion and the second mount portion, wherein a peripheral wall portion that is formed in a frame shape which is extended outwardly and which has a tip opened is integrally provided with an external surface of the second wall portion at an opposite side to the first flow channel;

the opening of the peripheral wall portion is closed by a lid fastened to a bottom of a third electronic component; and a region surrounded by the peripheral wall portion and the lid forms a second flow channel for the coolant.

2. The power conversion device according to claim 1, wherein a rib is integrally provided with the second wall portion and the peripheral wall portion.

3. The power conversion device according to claim 1, wherein a flow-channel portion of the first flow channel held between the first connection portion and the second wall portion is a communication portion; and a cross-sectional area of a discharging opening of the communication portion is smaller than a cross-sectional area of an inlet opening.

4. The power conversion device according to claim 2, wherein a flow-channel portion of the first flow channel held between the first connection portion and the second wall portion is a communication portion; and a cross-sectional area of a discharging opening of the communication portion is smaller than a cross-sectional area of an inlet opening.

5. A power conversion device comprising:

a cooling structure capable of cooling down, by a coolant that flows through a first flow channel formed by a first wall portion and a second wall portion facing with each other, a first electronic component and a second electronic component mounted on an external surface of the first wall portion, wherein the first wall portion is formed in a stepwise shape, and comprises:

a first mount portion on which the first electronic component is mounted;

a second mount portion which has a different height from the first mount portion, and on which the second electronic component is mounted; and a first connection portion that is extended between the first mount portion and the second mount portion, wherein the second wall portion is formed in a stepwise shape along a shape of the first wall portion wherein a peripheral wall portion that is formed in a frame shape which is extended outwardly and which has a tip opened is integrally provided with an external surface of the second wall portion at an opposite side to the first flow channel;

the opening of the peripheral wall portion is closed by a lid fastened to a bottom of a third electronic component; and a region surrounded by the peripheral wall portion and the lid forms a second flow channel for the coolant.

6. The power conversion device according to claim 5, wherein a rib is integrally provided with the second wall portion and the peripheral wall portion.

7. The power conversion device according to claim 5, wherein a flow-channel portion of the first flow channel held between the first connection portion and the second wall portion is a communication portion; and a cross-sectional area of a discharging opening of the communication portion is smaller than a cross-sectional area of an inlet opening.

8. The power conversion device according to claim 6, wherein a flow-channel portion of the first flow channel held between the first connection portion and the second wall portion is a communication portion; and a cross-sectional area of a discharging opening of the communication portion is smaller than a cross-sectional area of an inlet opening.

9. A power conversion device comprising:

a cooling structure capable of cooling down, by a coolant that flows through a first flow channel, a first electronic component and a second electronic component, wherein the first flow channel is formed by an internal surface of a first wall portion, an internal surface of a second wall portion, a surface of a first plate that is attached to the first electronic component, and a surface of a second plate that is attached to the second electronic component, wherein said internal surfaces of said first and second wall portions face each other, and wherein said first electronic component and said second electronic component are mounted on an external surface of the first wall portion, wherein the first wall portion is formed in a stepwise shape, and comprises:

a first mount portion on which the first electronic component is mounted;

a second mount portion, which has a different height from the first mount portion, and on which the second electronic component is mounted; and a first connection portion that extends between the first mount portion and the second mount portion and connects the first mount portion to the second mount portion;

and wherein the second wall portion is formed in a stepwise shape along the shape of the first wall portion and comprises:

a first opposing portion that faces the first mount portion;

a second opposing portion that faces the second mount portion;

a second connection portion that faces the first connection portion and extends between the first and second opposing portions and connects the first and second opposing portions;

wherein a rib that is extended along a flowing direction of the coolant is provided on an external surface of the second wall portion at an opposite side to the first flow channel;

wherein the rib forms a part of the second connection portion;

wherein a peripheral wall portion that is formed in a frame shape which is extended outwardly and which has a tip opened is integrally provided with an external surface of the second wall portion at an opposite side to the first flow channel;

the opening of the peripheral wall portion is closed by a lid fastened to a bottom of a third electronic component; and a region surrounded by the peripheral wall portion and the lid forms a second flow channel for the coolant.

10. The power conversion device according to claim 9, wherein the rib is integrally provided with the second wall portion and the peripheral wall portion.

11. The power conversion device according to claim 9,
wherein a flow-channel portion of the first flow channel held between the first connection portion and the second wall portion is a communication portion; and a cross-sectional area of a discharging opening of the communication portion is smaller than a cross-sectional area of an inlet opening.

12. The power conversion device according to claim 10,
wherein a flow-channel portion of the first flow channel held between the first connection portion and the second wall portion is a communication portion; and a cross-sectional area of a discharging opening of the communication portion is smaller than a cross-sectional area of an inlet opening.

* * * * *